(12) United States Patent
Satou

(10) Patent No.: US 8,362,370 B2
(45) Date of Patent: Jan. 29, 2013

(54) ELECTRONIC CIRCUIT BOARD AND ELECTRONIC CIRCUIT BOARD SHIELD METHOD AND CONSTRUCTION

(75) Inventor: Kazuto Satou, Tokyo (JP)

(73) Assignee: NEC Display Solutions, Ltd., Tokyo (JP)

( * ) Notice: Subject to any disclaimer, the term of this patent is extended or adjusted under 35 U.S.C. 154(b) by 302 days.

(21) Appl. No.: 12/733,952

(22) PCT Filed: Nov. 21, 2008

(86) PCT No.: PCT/JP2008/071260
§ 371 (c)(1),
(2), (4) Date: Mar. 31, 2010

(87) PCT Pub. No.: WO2009/069560
PCT Pub. Date: Jun. 4, 2009

(65) Prior Publication Data
US 2010/0230153 A1    Sep. 16, 2010

(30) Foreign Application Priority Data
Nov. 26, 2007  (JP) .................................. 2007-304384

(51) Int. Cl.
H05K 9/00 (2006.01)
(52) U.S. Cl. .......................... 174/354; 174/377; 361/816
(58) Field of Classification Search .................. 174/366, 174/377, 382, 354; 361/816
See application file for complete search history.

(56) References Cited

U.S. PATENT DOCUMENTS

| | | | |
|---|---|---|---|
| 5,428,508 A * | 6/1995 | Pronto ........................... | 361/818 |
| 5,876,223 A * | 3/1999 | Kaneshige et al. ........... | 439/108 |
| 6,881,894 B2 | 4/2005 | Kai | |
| 2003/0070824 A1 | 4/2003 | Kai | |

FOREIGN PATENT DOCUMENTS

| | | |
|---|---|---|
| CN | 1196870 A | 10/1998 |
| JP | 6-275984 | 9/1994 |
| JP | 6-314286 A | 11/1994 |
| JP | 7-183683 A | 7/1995 |
| JP | 2000-156588 | 6/2000 |
| JP | 2000-307285 A | 11/2000 |
| JP | 2001-77575 A | 3/2001 |
| JP | 2002-124794 | 4/2002 |
| JP | 2002-124794 A | 4/2002 |

(Continued)

OTHER PUBLICATIONS

Japanese Office Action dated Jun. 15, 2011, with English translation.
Chinese Office Action dated Jan. 11, 2012, with English translation.
Japanese Office Action dated Mar. 27, 2012, with partial English translation.

*Primary Examiner* — Hung Ngo
(74) *Attorney, Agent, or Firm* — McGinn IP Law Group, PLLC

(57) ABSTRACT

The present invention has the object of providing a technology that can facilitate inexpensive shields of individual electronic components with good heat exchange efficiency, the electronic circuit board according to the present invention being provided with: a plurality of conductor parts in a standing state that can extend and contract on a ground pattern that surrounds an electronic component on the electronic circuit board, a conductive plate, and securing members for holding the plate such that the plurality of conductor parts contact the plate in a state in which the conductor parts contract from their natural length.

3 Claims, 3 Drawing Sheets

FOREIGN PATENT DOCUMENTS

| | | |
|---|---|---|
| JP | 2002-314286 A | 10/2002 |
| JP | 2004-71629 | 3/2004 |
| JP | 2006-237036 | 9/2006 |
| WO | WO 97/11592 | 3/1997 |

\* cited by examiner

ELECTRONIC CIRCUIT BOARD AND ELECTRONIC CIRCUIT BOARD SHIELD METHOD AND CONSTRUCTION

TECHNICAL FIELD

The present invention relates to an electronic circuit board for blocking electromagnetic waves radiated from components mounted on the electronic circuit board, and to an electronic circuit board shield method and construction.

BACKGROUND ART

FIG. 1 shows an example of radiation of electromagnetic waves from electronic components mounted on an electronic circuit board in which a circuit board has been printed (hereinbelow referred to as "printed board").

FIG. 1 shows a state in which electromagnetic waves 4 are radiated from LSI (Large-Scale Integration) 2 as the electronic component mounted on printed circuit board 1 and a state in which electromagnetic waves 4 are radiated from wiring 3 that joins LSI 2.

To prevent electromagnetic wave interference that includes generation of the above-described electromagnetic wave radiation, a method known as shielding is used in which circuits or components that radiate electromagnetic waves are enclosed by a metal material. Patent Document 1 (JP-A-2006-237036) discloses a construction in which components are each separately shielded by a flexible board on which shield wiring composed of mesh wiring is provided.

FIG. 2 shows an example in which only component 2, that radiates electromagnetic waves, and circuit parts in the vicinity of component 2 are enclosed by shield part 5.

The four sides of shield part 5 that contact the printed board are brought into a conductive state with a ground pattern on printed board 1. When only component 2 and the circuit parts in its vicinity are enclosed by shield part 5 and printed wiring 3 for signals, or when small parts 14 are arranged at parts of shield part 5 that contacts printed board 1, as shown in FIG. 2, cutouts 6 must be provided in shield part 5 to avoid these parts.

The principles of the effect realized by a shield that encloses only components that radiate electromagnetic waves are next explained using the sectional view of FIG. 3.

Due to the electric field and magnetic field of electromagnetic waves 4 radiated from the surface of LSI 2, current 7 is generated in the surface of shield part 5. Due to the skin effect of shield part 5 that has a fixed thickness, current 7 only flows over the surface of the other side that is irradiated by electromagnetic wave 4, returns by way of the ground pattern on printed board 1 to LSI 2, and cancels energy.

When there are cutouts 6 in shield part 5 as shown in FIG. 2, current 7 that flows through shield part 5 may pass through the end surface of shield part 5 by the path shown by arrow 7 and return to LSI 2.

When current returns by the path shown by arrow 7 in FIG. 4, a slit antenna is formed by the current in the reverse direction that flows through shield part 5 that is a conductor and the ground pattern of printed board 1 and insulators between these currents (in this case, air).

Normally, wavelength λ of a particular frequency F (MHz) is found by the equation λ(m)=(300/F)×contraction rate. In order for metal to function effectively as an antenna, the metal must have a fixed length with respect to the wavelength in order that a harmonic current such as λ/4 or λ/2, depending on the conditions of its arrangement, resonate in the conductor, but it is known that a slit antenna functions as an effective antenna even when the length of slits (cutouts) is sufficiently short with the respect to wavelength. As a result, the cutouts may function as an effective slit antenna and electromagnetic wave radiation may be generated.

One shield method consists of enclosing the entire printed board.

In the case of complete sealing, and moreover, in the case of a metal material having a thickness of at least the depth to which harmonic current enters due to the skin effect, harmonic current flows only inside the shield component, and radiation is therefore not generated outside the shield.

However, because securing a printed board within a shield component of this construction is difficult, separate shield materials are typically combined to realize the shield component. In such cases, a portion of the harmonic current that flows through the metal surface flows through the gaps of the fitting parts of each shield material, and this portion reaches the surface of the shield component.

When using shield material of a size that would enclose a printed board, the shield material functions as a high-efficiency antenna such as the previously described ½-wavelength or ¼-wavelength antenna with the current that flows through fitting parts as the excitation source and electromagnetic wave radiation is generated.

Patent Document 1: JP-A-2006-237036

DISCLOSURE OF THE INVENTION

When electronic components are each covered by shield material, the constituent parts become numerous, fabrication becomes tedious and time-consuming, and fabrication costs increase.

When shield material of a size that would enclose a printed board, the shield material functions as a high-efficiency antenna such as the previously described ½-wavelength or ¼-wavelength antenna with the current that flows through fitting parts as the excitation source and electromagnetic wave radiation is generated.

Components that are mounted on a printed board are steadily increasing in number with higher integration. In addition to the above-described electromagnetic waves, heat is generated with the conduction of electricity from wiring and components on a printed board. This generation of heat necessitates the implementation of some form of heat exchange to reduce the board temperature to less than a predetermined temperature, but a shield that encloses the printed board itself or a configuration in which each part is shielded by a flexible board such as disclosed in Patent Document 1 places components and wiring within a closed space and does not expose the components and wiring to gas that can effect heat exchange. As a result, extremely inefficient heat exchange is carried out through the shield component, parts for heat exchange take up space, and these factors lead to an increase in the size of the device and an increase in power consumption.

Although a shield part that is provided with cutouts features good heat exchange efficiency, the cutouts may function as high-efficiency slit antennas and generate electromagnetic wave radiation.

It is an object of the present invention to provide a technology that can facilitate inexpensive shields of individual electronic components with superior heat exchange efficiency.

In addition to achieving the above object, the present invention has the object of providing a technology that enables a shield to block electromagnetic wave interference that includes the generation of electromagnetic wave radiation and that does not function as a slit antenna that radiates electromagnetic waves.

The electronic circuit board of the present invention is equipped with:
a plurality of conductor parts that can extend and contract arranged in a standing state on a ground pattern that surrounds an electronic component on the electronic circuit board;
a conductive plate; and
securing members for holding the plate such that the plurality of conductor parts contact the plate in a state in which the conductor parts contract from their natural length.

The shield construction of an electronic circuit board of the present invention is equipped with:
a plurality of conductor parts that can extend and contract arranged in a standing state on a ground pattern that surrounds an electronic component on the electronic circuit board; and
securing members for holding the electronic circuit board such that the plurality of conductor parts contact a conductive plate in a state in which the conductor parts contract from their natural length.

The shield method of an electronic circuit board of the present invention includes steps of:
providing a plurality of conductor parts in a standing state on a ground pattern that surrounds an electronic component on an electronic circuit board; and
securing a conductive plate by securing members such that the plurality of conductor parts contact the plate in a state in which the conductor parts contract from their natural length.

EXPLANATION OF REFERENCE NUMBERS 101 printed board
102 LSI
111 spring
112 conductor part
113 plate
115 securing member

BEST MODE FOR CARRYING OUT THE INVENTION

An embodiment of the present invention is next described with reference to the accompanying figures.

Figure 1:
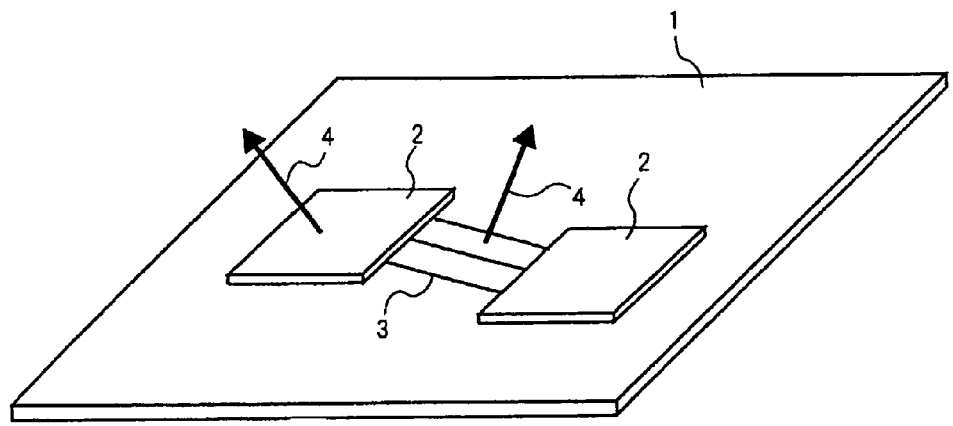
FIG. 1 shows an example of the radiation of electromagnetic waves from electronic components that are mounted on an electronic circuit board.
Figure 2:
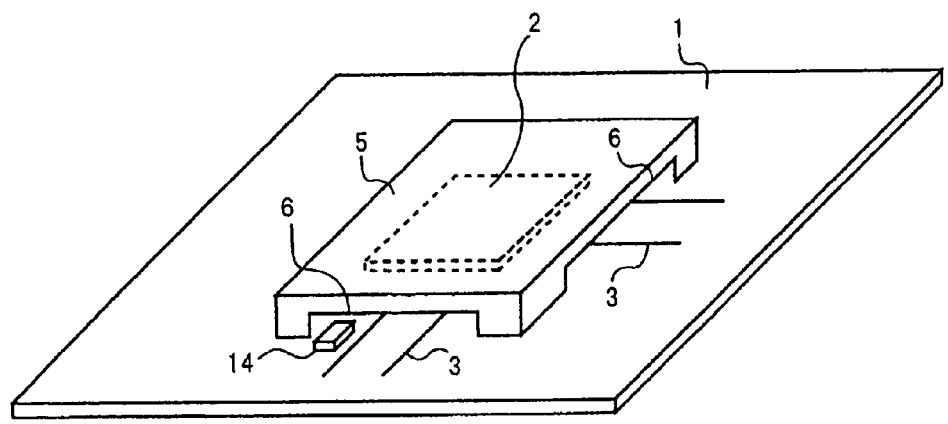
FIG. 2 shows an example in which only a component that radiates electromagnetic waves and the circuit portion in the vicinity of the component are enclosed by a shield part.
Figure 3:
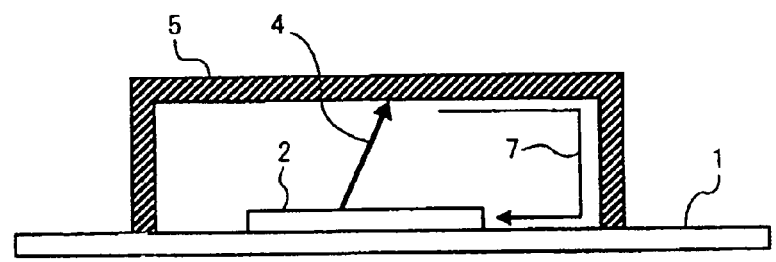
FIG. 3 is an explanatory view for explaining the principles of the effect realized by a shield that encloses only a component that radiates electromagnetic waves.
Figure 4:
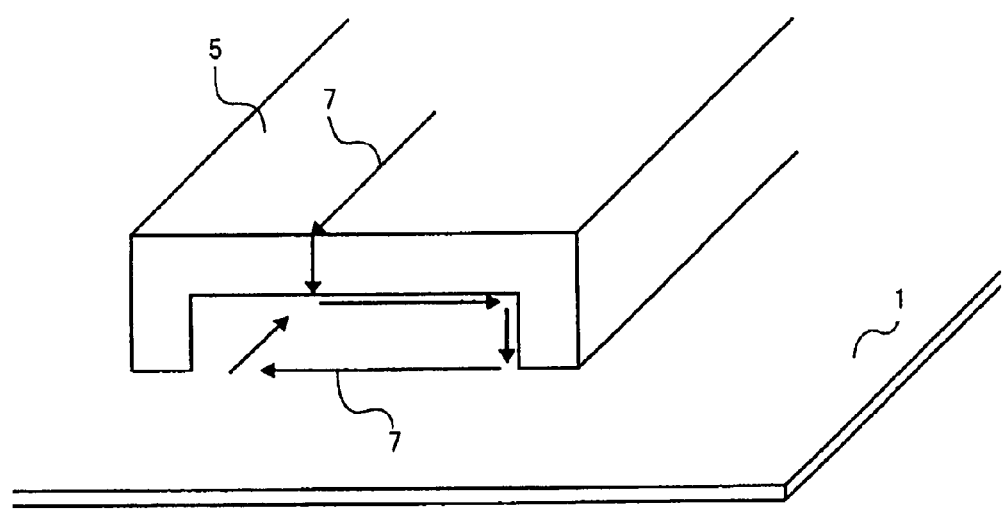
FIG. 4 shows the current path of a shield that is provided with cutouts.
Figure 5:
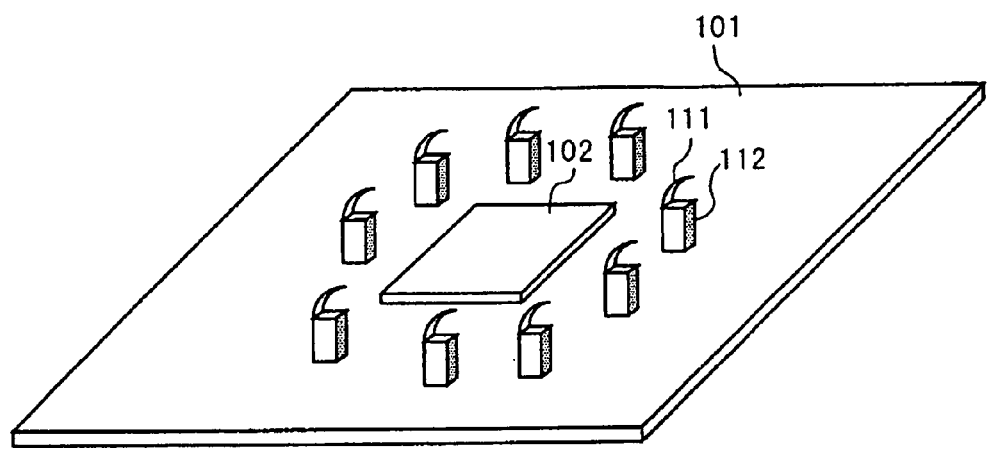
FIG. 5 is a perspective view showing a stage of the fabrication steps of an embodiment of the electronic circuit board according to the present invention.
Figure 6:
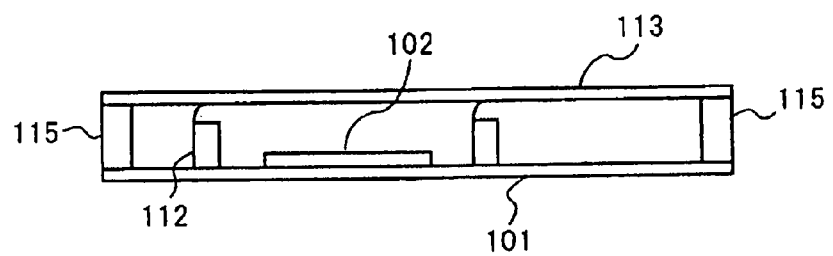
FIG. 6 is a sectional view showing a stage of the fabrication steps of an embodiment of the electronic circuit board according to the present invention.

FIG. 5 and FIG. 6 are a perspective view and a sectional view showing stages of the fabrication steps of an embodiment of the electronic circuit board according to the present invention.

As shown in FIG. 5, a plurality of conductor parts 112 are provided standing on a ground pattern at positions of printed board 101 that surround circuits or a components such as LSI 102 that require a shield. The ends of conductor parts 112 opposite the printed board 101 side are provided with springs 111. The range that is enclosed by these conductor parts 112 is preferably as narrow as possible. Springs 111 may also be of coil form in addition to the plate-spring form shown in the figure. In addition, conductor parts 112 may themselves function as plungers provided with spring mechanisms inside, but no particular limits apply to the construction of conductor parts 112 as long as conductor parts 112 can extend and contract.

Next, as shown in FIG. 6, metal conductive plate 113 is arranged to cover the entire surface of printed board 101 parallel with probability 101 and is secured by securing members 115 that use, for example, screws. The spacing between printed board 101 and plate 113 is such that springs 111 contact plate 113 in a bent state, i.e., a state in which springs 111 contract from their natural length. When springs 111 and plate 113 come into contact, plate 113 electrically contacts the ground of printed board 101 by way of conductor parts 112 and establishes conductivity to obtain a shield effect.

In the case of the present embodiment, the spacing of the arrangement of conductor parts 112 acts as the dimension of the openings of the shield parts.

In contrast to the radiation resulting from slit antennas that was previously described, it is known that, in order to block leakage of electromagnetic waves from the openings of a shield plate, the width of these openings is typically set to be no greater than one-fourth of the wavelength.

As described hereinabove, the equation for calculating wavelength is represented as:

$$\lambda(m) = (300/F) \times \text{contraction rate}$$

In the case of the present embodiment, openings of the shield are adjacent to printed board 101, and the calculation is therefore carried out by using as the contraction rate, a typical contraction rate 0.55 that is found from the permittivity of the printed board rather than of air. If the wavelength of the electromagnetic waves that are the object is a maximum of 1000 MHz, a one-quarter wavelength of 1000 MHz is calculated to obtain $((300 \div 1000) \div 4) \times 0.55 = 0.0415$ m.

In other words, conductor parts 112 shown in FIG. 5 and FIG. 6 are preferably arranged adjacently at a spacing no greater than 4 cm and within the smallest possible range to enclose parts or circuits that are to be shielded. By implementing this type of arrangement, slit antennas are constructed within the shield and there is no radiation to the outside resulting from the shield effect.

Because the range that is enclosed by these conductor parts 112 is a narrow range such as the range within the vicinity of integrated circuits, the length over which a high-frequency current flows, is shortened and cases in which a ¼-wavelength or ½-wavelength antenna is formed are therefore decreased from a shield method in which entire printed board 101 is enclosed; and even in cases in which the range enclosed by conductor parts 112 is equal to or greater than the length that forms an antenna, the high-frequency current flows only within the above-described shield and thus forms the antenna inside the shield, whereby the leakage of electromagnetic waves to the outside can be prevented.

In the present embodiment, the effect realized by individually shielding electronic components is obtained by a simple configuration in which conductor parts are provided surrounding electronic components and in which the upper surfaces of the conductor parts and electronic components are then covered by a conductive plate. Because the electronic components are themselves exposed to gas that can effect heat exchange, high-efficiency heat exchange is possible, the device can be reduced in size, and energy consumption can be reduced.

A configuration for a single LSI is shown in FIG. 5 and FIG. 6, but when a plurality of electronic components are mounted on a single printed board, conductor parts are provided around each individual electronic component. The conductive plate may take the form of a single plate that covers one entire printed board or the form of single plates that cover each individual electronic component.

When a configuration is adopted in which one entire printed board is covered by a single plate, the number of work steps can be reduced. When a configuration is adopted in which each individual electronic component is covered by one plate, a greater improvement in heat exchange efficiency can be achieved.

In a shield case that accommodates a printed board, when the plate of the shield case on the side that faces conductor parts 112 is conductive, the shield case plate can be used as conductive plate 113, and in this shield case, securing members 115 may hold the printed board such that conductor parts 112 contact the case plate in a state in which conductor parts 112 contract from their natural length, whereby the effect of individually shielding electronic components is obtained by a simpler configuration.

In the present invention that is configured as described above, the effect of individual shielding of electronic components is obtained by a simple configuration in which conductor parts are provided around the electronic components and the upper surfaces of this construction are then covered by a conductive plate. In addition, the electronic components are themselves exposed to gas that can effect heat exchange, whereby high-efficiency heat exchange is enabled, and a device of a smaller size and lower power consumption can be realized.

Although the invention of the present application was described above with reference to an embodiment, the invention of the present application is not limited to the above-described embodiment. As shown in the example of the first embodiment, the configuration and details of the invention of the present application is open to various modifications within the scope of the invention of the present application that will be understood by one of ordinary skill in the art.

This application claims priority based on JP-A-2007-304384 for which application was submitted on Nov. 26, 2007 and incorporates all of the disclosures of that invention.

What is claimed is:

1. An electronic circuit board, comprising:
   a plurality of conductor parts that extends and contracts, and is arranged in a standing state on a ground pattern that surrounds an electronic component on the electronic circuit board;
   a conductive plate which covers an entirety of a surface of an electronic component mounted side of said electronic circuit board, and which is brought into electrical contact with said ground pattern by said conductor parts; and
   securing members arranged in a circumference of said electronic circuit board, for holding said conductive plate such that said plurality of conductor parts contacts said plate in a state in which said conductor parts contract from their natural length;
   wherein said plurality of conductor parts is arranged on an inside of the circumference by said securing members for an area bounded by said plurality of conductor parts which becomes smaller than an area bounded by said conductive plate, and said plurality of conductor parts is positioned to stand adjacent to a location whose value is not greater than a value determined according to electromagnetic waves radiated by the electronic component.

2. A shield method of an electronic circuit board, said method comprising:
   providing, in a standing state, a plurality of conductor parts that extends and contracts on a ground pattern that surrounds an electronic component on an electronic circuit board; and
   securing a conductive plate which covers an entirety of a surface of an electronic component mounted side of said electronic circuit board, and which is brought into electrical contact with said ground pattern by said conductor parts, by securing members arranged on a circumference of said electronic circuit board, such that said plurality of conductor parts contacts said plate in a state in which said conductor parts contract from their natural length,
   wherein said plurality of conductor parts is arranged on an inside of a circumference by said securing members for an area bounded by said plurality of conductor parts which becomes smaller than an area bounded by said conductive plate, and said plurality of conductor parts are positioned to stand adjacent to a location whose value is not greater than a value determined according to electromagnetic waves radiated by the electronic component.

3. A shield method of an electronic circuit board, said method comprising:
   providing, in a standing state, a plurality of conductor parts that extends and contracts on a ground pattern that surrounds an electronic component on an electronic circuit board; and
   securing the electronic circuit board by securing members such that said plurality of conductor parts contacts a conductive plate which covers an entire surface of an electronic component mounted side of said electronic circuit board, and which is brought into electrical contact with said ground pattern by said conductor parts, by securing members arranged in a circumference of said electronic circuit board, in a state in which said conductor parts contract from their natural length,
   wherein said plurality of conductor parts is arranged on an inside of the circumference by said securing members for an area bounded by said plurality of conductor parts which becomes smaller than an area bounded by said conductive plate, and said plurality of conductor parts is positioned to stand adjacent to a location whose value is not greater than a value determined according to electromagnetic waves radiated by the electronic component.

* * * * *